(12) United States Patent
Pandey et al.

(10) Patent No.: US 11,551,769 B2
(45) Date of Patent: *Jan. 10, 2023

(54) INTEGRATED CIRCUITS AND METHODS FOR DYNAMIC ALLOCATION OF ONE-TIME PROGRAMMABLE MEMORY

(71) Applicant: NXP USA, Inc., Austin, TX (US)

(72) Inventors: Rakesh Pandey, Austin, TX (US); Mohit Arora, Austin, TX (US); Jun Xie, Shanghai (CN)

(73) Assignee: NXP USA, Inc., Austin, TX (US)

( * ) Notice: Subject to any disclaimer, the term of this patent is extended or adjusted under 35 U.S.C. 154(b) by 665 days.

This patent is subject to a terminal disclaimer.

(21) Appl. No.: 16/002,195

(22) Filed: Jun. 7, 2018

(65) Prior Publication Data

US 2018/0286489 A1    Oct. 4, 2018

Related U.S. Application Data

(62) Division of application No. 15/253,023, filed on Aug. 31, 2016, now Pat. No. 10,020,067.

(51) Int. Cl.
| | | |
|---|---|---|
| *G11C 17/16* | (2006.01) | |
| *G11C 29/52* | (2006.01) | |
| *G06F 11/10* | (2006.01) | |
| *G06F 12/10* | (2016.01) | |

(52) U.S. Cl.
CPC .......... *G11C 17/16* (2013.01); *G06F 11/1068* (2013.01); *G06F 12/10* (2013.01); *G11C 29/52* (2013.01); *G06F 2212/2142* (2013.01)

(58) Field of Classification Search
CPC ..... G11C 17/16; G11C 29/52; G06F 11/1068; G06F 12/10; G06F 2212/2142
See application file for complete search history.

(56) References Cited

U.S. PATENT DOCUMENTS

| | | | |
|---|---|---|---|
| 9,606,865 B2* | 3/2017 | Yang | G06F 11/1068 |
| 2006/0085593 A1* | 4/2006 | Lubbers | G06F 11/1076 |
| | | | 711/114 |
| 2006/0085594 A1* | 4/2006 | Roberson | G06F 11/1076 |
| | | | 711/114 |
| 2006/0085617 A1* | 4/2006 | Roberson | G06F 11/1441 |
| | | | 711/170 |
| 2008/0005458 A1* | 1/2008 | Lawson | G06F 13/28 |
| | | | 711/112 |
| 2012/0221533 A1* | 8/2012 | Burness | G06F 11/1076 |
| | | | 707/690 |
| 2014/0281228 A1* | 9/2014 | O'Broin | G06F 3/061 |
| | | | 711/118 |
| 2016/0246672 A1* | 8/2016 | Yang | G06F 11/1068 |

\* cited by examiner

*Primary Examiner* — Joseph D Torres

(57) ABSTRACT

A one-time programmable (OTP) memory has a plurality of pages. A predefined section of each page is configured to store error policy bits. When an indicator in a first predefined location has a first value, the page is configured to store data with error correction code (ECC) bits, and when the indicator has a second value, at least a portion of the page is configured to store data with redundancy. Address translation circuitry is configured to, in response to receiving an access address, use a second predefined location of an accessed page of the plurality of pages accessed by the access address to determine a physical address in the accessed page which corresponds to the access address.

20 Claims, 5 Drawing Sheets

| PHYSICAL WORD | CORRECTION MODE | LOGICAL ADDRESS | DEC |
|---|---|---|---|
| 1 | 1 | 0000 | 0 |
| 2 | 1 | 0002 | 2 |
| 3 | 1 | 0004 | 4 |
| 4 | 1 | 0006 | 6 |
| 5 | 1 | 0008 | 8 |
| 6 | 1 | 000A | 10 |
| 7 | 1 | 000C | 12 |
| 8 | 1 | 000E | 14 |
| 9 | 1 | 0010 | 16 |
| 10 | 1 | 0012 | 18 |
| 11 | 1 | 0014 | 20 |
| 12 | 1 | 0016 | 22 |
| 13 | 1 | 0018 | 24 |
| 14 | 1 | 001A | 26 |
| 15 | 1 | 001C | 28 |
| 16 | 1 | 001E | 30 |
| 17 | 1 | 0020 | 32 |
| 18 | 1 | 0022 | 34 |
| 19 | 1 | 0024 | 36 |
| 20 | 1 | 0026 | 38 |
| 21 | 1 | 0028 | 40 |
| 22 | 1 | 002A | 42 |
| 23 | 1 | 002C | 44 |
| 24 | 1 | 002E | 46 |
| 25 | 1 | 0030 | 48 |
| 26 | 1 | 0032 | 50 |
| 27 | 1 | 0034 | 52 |
| 28 | 1 | 0036 | 54 |
| 29 | 1 | 0038 | 56 |
| 30 | 1 | 003A | 58 |
| 31 | 1 | 003C | 60 |
| 32 | 1 | 003E | 62 |

FIG. 4

| PHYSICAL WORD | CORRECTION MODE | LOGICAL ADDRESS | DEC |
|---|---|---|---|
| 1 | 1 | 0000 | 0 |
| 2 | 1 | 0002 | 2 |
| 3 | 1 | 0004 | 4 |
| 4 | 1 | 0006 | 6 |
| 5 | 1 | 0008 | 8 |
| 6 | 1 | 000A | 10 |
| 7 | 1 | 000C | 12 |
| 8 | 1 | 000E | 14 |
| 9 | 1 | 0010 | 16 |
| 10 | 1 | 0012 | 18 |
| 11 | 0 | 0014 | 20 |
| 12 | 0 | 0018 | 24 |
| 13 | 0 | 001C | 28 |
| 14 | 0 | 0020 | 32 |
| 15 | 0 | 0024 | 36 |
| 16 | 0 | 0028 | 40 |
| 17 | 0 | 002C | 44 |
| 18 | 0 | 0030 | 48 |
| 19 | 0 | 0034 | 52 |
| 20 | 0 | 0038 | 56 |
| 21 | 0 | 003C | 60 |
| 22 | 0 | 0040 | 64 |
| 23 | 0 | 0044 | 68 |
| 24 | 0 | 0048 | 72 |
| 25 | 0 | 004C | 76 |
| 26 | 0 | 0050 | 80 |
| 27 | 0 | 0054 | 84 |
| 28 | 0 | 0058 | 88 |
| 29 | 0 | 005C | 92 |
| 30 | 0 | 0060 | 96 |
| 31 | 0 | 0064 | 100 |
| 32 | 0 | 0068 | 104 |

FIG. 5

| PHYSICAL WORD | CORRECTION MODE | LOGICAL ADDRESS | DEC |
|---|---|---|---|
| 1 | 0 | 0000 | 0 |
| 2 | 0 | 0004 | 4 |
| 3 | 0 | 0008 | 8 |
| 4 | 0 | 000C | 12 |
| 5 | 0 | 0010 | 16 |
| 6 | 0 | 0014 | 20 |
| 7 | 0 | 0018 | 24 |
| 8 | 0 | 001C | 28 |
| 9 | 0 | 0020 | 32 |
| 10 | 0 | 0024 | 36 |
| 11 | 0 | 0028 | 40 |
| 12 | 0 | 002C | 44 |
| 13 | 0 | 0030 | 48 |
| 14 | 0 | 0034 | 52 |
| 15 | 0 | 0038 | 56 |
| 16 | 0 | 003C | 60 |
| 17 | 0 | 0040 | 64 |
| 18 | 0 | 0044 | 68 |
| 19 | 0 | 0048 | 72 |
| 20 | 0 | 004C | 76 |
| 21 | 0 | 0050 | 80 |
| 22 | 0 | 0054 | 84 |
| 23 | 0 | 0058 | 88 |
| 24 | 0 | 005C | 92 |
| 25 | 0 | 0060 | 96 |
| 26 | 0 | 0064 | 100 |
| 27 | 0 | 0068 | 104 |
| 28 | 0 | 006C | 108 |
| 29 | 0 | 0070 | 112 |
| 30 | 0 | 0074 | 116 |
| 31 | 0 | 0078 | 120 |
| 32 | 0 | 007C | 124 |

FIG. 6

INTEGRATED CIRCUITS AND METHODS FOR DYNAMIC ALLOCATION OF ONE-TIME PROGRAMMABLE MEMORY

BACKGROUND

Field

This disclosure relates generally to integrated circuits that use one-time programmable memory, and more specifically, to integrated circuit devices with dynamic allocation of one-time programmable memory.

Related Art

Microprocessors often need one-time programmable (OTP) devices such as fuses to store device configurations, trim bits, hardware keys, device identifiers, region specific attributes, repair information, etc. Often device revisions can be avoided by programming boot code patches in the OTP memories. In the product flow, OTP's are programmed at multiple stages and in different ways by the original manufacturer and subsequent developers. While it is always desirable to have as much OTP storage as possible, depending on the technology, there is high cost associated with the OTP in terms of area required. Since the OTP fuses are programmed (electrically oriented) at high voltage, they can be very sensitive and error prone. As the fuses carry critical information it is desirable to ensure error free operation of the fuses and to have the ability to correct any accidental programming and/or wrong values.

Error correction codes (ECCs) and redundancy can be implemented to detect and correct fuse errors. ECCs store parity bits along with information bits, and certain number of errors in a codeword can be detected and even corrected depending on the ECC scheme being used. Redundancy schemes are used to improve the yield of memory products, where redundant elements are used to replace faulty elements. Redundancy provides fault tolerance in chips and hence improves the product yield. While redundancy techniques are granular and allow bit by bit programming, redundancy repair is not area efficient since a duplicate of the data is stored. For every bit there is a redundant bit. ECC on the other hand, allocates certain ECC bits for a word, but may not be as robust as redundancy in correcting errors.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIGS. 4-6 illustrate tables showing examples of memory usage for different combinations of error correction techniques for the OTP memory of FIG. 2.

DETAILED DESCRIPTION

Embodiments of system and methods are disclosed that allow one or more error correction methods to be chosen for a one-time programmable memory device based on programming needs. A unique address translation scheme allows error correction code (ECC) bits and redundancy bits to co-exist in the same one-time programmable (OTP) memory. A first fuse bank is arranged to allow dynamic selection of ECC or redundancy error correction for each page of the OTP memory after a processing system such as a system on a chip (SOC) is manufactured. The fuses are divided into multiple pages, allowing each page of the the fuses to be managed and allocated to a particular error correction scheme independently of the others. In this way, users can configure the OTP memory to use a mix of error correction techniques that efficiently uses available fuse bit capacity while providing the desired programming flexibility and accuracy.

Figure 1:
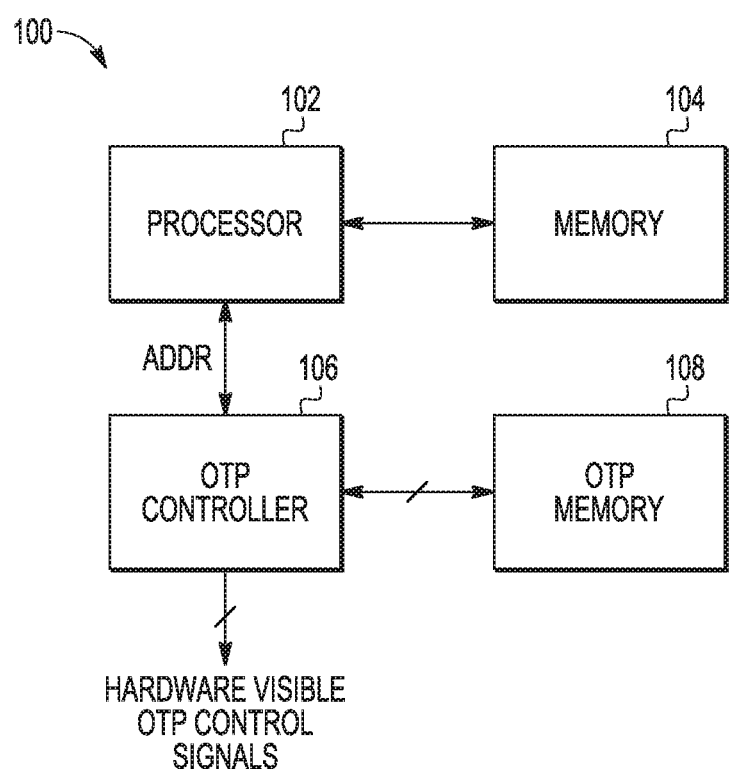
FIG. 1 is a block diagram of an integrated circuit system in accordance with selected embodiments of the invention.

FIG. 1 is a block diagram of an integrated circuit system 100 in accordance with selected embodiments of the invention including processor 102, memory device 104, one-time programmable (OTP) memory controller, and OTP memory device 108. Processor 102 is configured to provide address information to memory device 104 and to OTP controller 106, as well as to send and receive data to and from memory 104 and OTP controller 106.

Processor 102 is an information handling system which can be designed to give independent computing power to one or more users in many forms including but not limited to mainframes, minicomputers, servers, workstations, personal computers, notepads, electronic games, automotive and other embedded systems, cell phones and various other wireless devices. Memory device 104 can include one or more types of volatile and non-volatile memory as associated controllers, such as dynamic random access memory, static random access memory, cache, flash, read only memory (ROM), programmable ROM (PROM), electrically PROM (EPROM) and electrically erasable EPROM (EEPROM), among others.

OTP controller 106 is configured to send and receive data to and from OTP memory 108, and to send data from OTP memory to processor 102 and other components (not shown) in system 100 or external to system 100. The information stored in OTP memory 108 is not erasable and can be programmed only once. When the data is programmed, error correction techniques such as ECC and redundancy can be used to determine whether the data was accurately written into OTP memory 108. Various types of ECC techniques can be used including single bit error correction methods such as Hamming code, double bit error correction methods such as Bose-Chaudhuri-Hocquenghem (BCH) code, or other suitable method. The inventive concepts described herein are not limited to any particular number of error correction, redundancy or parity method. For data redundancy, all or some of the actual data can be duplicated and stored in OTP memory 108 and used to correct any errors in the actual data. To this end, the error correcting information including either ECC bits or the redundant data can be provided from OTP memory 108 to OTP controller 106, depending on the error correcting scheme being used for a particular page.

Figure 2:
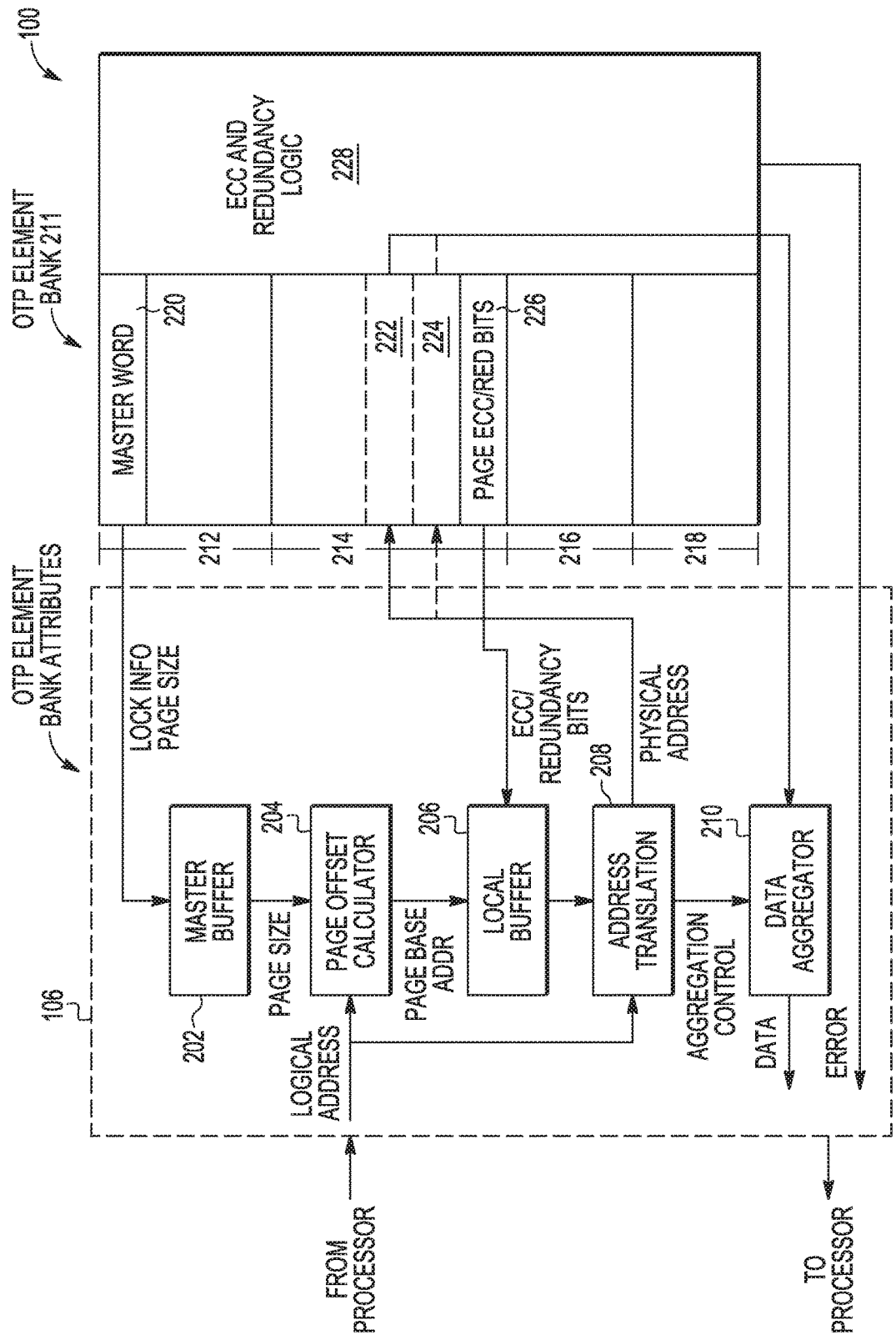
FIG. 2 is a block diagram of an embodiment of a one-time programmable (OTP) controller and memory that may be used in the integrated circuit system of FIG. 1.

ECC typically uses checksums and therefore requires fewer bits to detect and correct errors in the original data, compared to redundant data, which can require as much space as the original data. Fully redundant data allows the most accurate correction, however, and may be desirable to use for critical data. FIG. 2 is a block diagram of an embodiment of a one-time programmable (OTP) controller 106 and memory 108 that may be used in system 100 of FIG. 1 in which each page of memory 108 can use a particular error correction scheme independently of the other pages.

For example, pages where critical data is stored may use full redundancy while pages where complete accuracy is not required may use partial redundancy or ECC with parity bits.

In the embodiment shown, OTP controller 106 includes master buffer 202, page offset calculator 204, local buffer 206, address translation circuit 208, and data aggregator 210. OPT memory 108 includes OTP element bank 211 with an array of OTP elements, such as fuses or other suitable OPT device, along with ECC and redundancy logic 228. Each row in the array of OTP elements can include enough bits to store a word of data and the ECC or redundancy bits. Master word 220 can be the first word of OTP element bank 211 that is used to store information regarding the page size and word size of memory 108. The rest of OTP element bank 211 includes one or more pages of words. In the example shown, OTP element bank 211 includes four pages 212, 214, 216, 218, and each of pages 212-218 includes multiple words 222, 224 that include data and error correction information.

Figure 3:
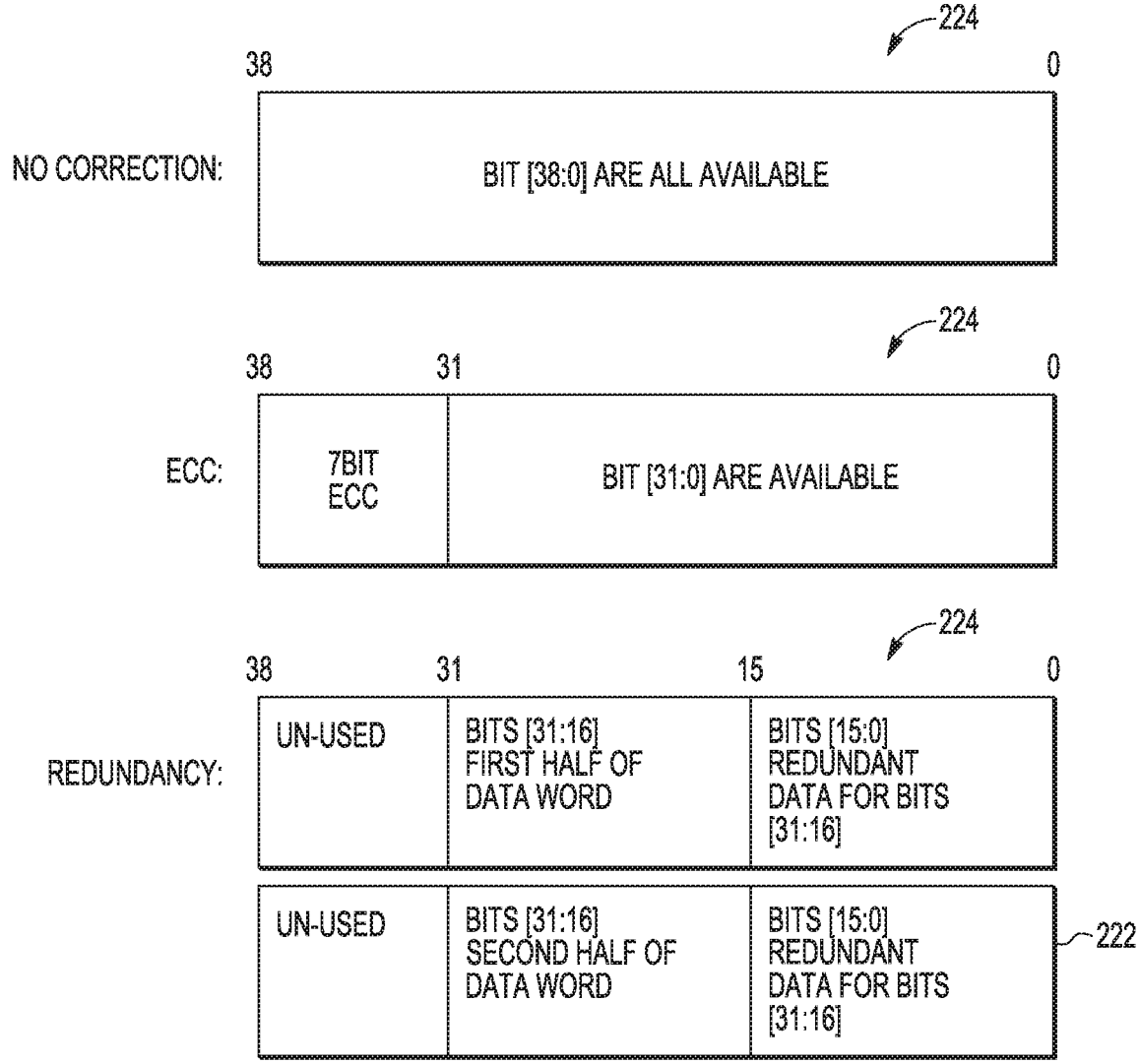
FIG. 3 is a diagram of OTP memory usage for different error correction techniques that may be used in the OTP memory of FIG. 2.

A predetermined row or word in each page includes error correction policy bits or information for the respective page. In the example shown, the first word 226 of page 214 includes information regarding the number of ECC or redundancy bits for each word in page 214. As an example, FIG. 3 is a diagram of OTP memory usage of different error correction techniques that may be used in the OTP memory 108 of FIG. 2. If no error correction scheme is being used, all of the bits in a word of OTP memory 108 are available for data since no space is required for error correction information, as shown by word 224. If an ECC scheme is being used to correct errors for page 214, the number of ECC bits required will depend on the type of ECC technique being used. In one implementation shown in word 224, 7 bits of ECC data is required for every 32 bits of data when a single bit correction and two bit detection (SEC-DEC Hamming Code) is used. Each word 224 thus includes 39 bits.

As another example, if redundancy is being used, two words or rows of data 224, 222 are required in OTP memory 108. In the example, each word still includes 39 bits with 16 bits of first word 224 being used for the first half of the data, 16 bits of first word 224 being used for a redundant copy of the first half of the data, and 7 bits of first word 222 being unused. For the second half of the data, 16 bits of second word 224 being used, 16 bits of second word 222 are used for a redundant copy of the second half of the data, and 7 bits of first word 222 are unused.

Thus, while the ECC scheme uses the space allocated for each word more efficiently than the redundancy scheme, the redundancy scheme is likely to provide more accurate error correction. Additionally, with the ECC scheme, the entire 32 bits are read/written together, so staged read/write is not possible within a word. With the redundancy scheme on the other hand, a dual read or write operation is required to program each word of data. Being able to choose to use the error correction scheme for each page allows some pages to store selected data using an ECC scheme, while other pages can store data using a redundancy scheme, thus offering programming flexibility and efficient use of available OTP elements. Note that redundancy error correction scheme can be used to store first word 226. Further, the ECC/redundancy bit information stored in first word 226 may alternatively be stored in another predetermined location in page 214, as well as for other pages 212, 216, 218.

OTP element bank 211 occupies logical address space, with a selectable number of pages 212-218. As shown, OTP element bank 211 includes 4 pages, however OTP element bank 211 can be divided into any suitable number of pages.

Master word 220 allows customers to define a size for pages in OTP element bank 211. Customers can select the page size based on desired flexibility and space requirements. The beginning boundary of each page has a logical address assuming all words are in ECC mode. If a page requires more bits per word of data due to redundancy mode, the logical addresses are still the same as the ECC mode at page boundaries, but address translation circuit 208 uses the ECC/redundancy bit to determine the type of error correction scheme being used for each page. Once the error correction scheme being used is known, the addresses for words that store data can be determined based on the number of bits required by the redundancy scheme.

During operation, master buffer 202 receives a copy of the page size for OTP element bank 211 in master word 220. Other attributes of OTP element bank 211, such as lock information to protect data from unauthorized access, for each page can also be provided. The page size is then provided to page offset calculator 204, which also receives a logical address from processor 102 when a read or write operation is being performed. Page offset calculator 203 uses the logical address and page size to determine the boundary address for the page where the physical address corresponding to the logical address will be found, assuming an ECC scheme is being used in each page. Page offset calculator 203 then provides a base address for the page that corresponds to the logical address from the processor to local buffer 206. Local buffer 206 also receives an ECC/redundancy bit from the first word 226 of the page that corresponds to the page base address. The ECC/redundancy bit indicates the error correction scheme being used for the page. For example, the first bit being set to "1" can be used to indicate redundancy is being used as the error correction scheme. The first bit being "0" can indicate the ECC scheme is being used. Note that if different types of ECC or redundancy schemes are being used, additional bits in the first word of the page can be coded to indicate a particular type of ECC or redundancy scheme being used.

Address translation circuit 208 receives the logical address from processor 102, and the page base address and ECC/redundancy bits from local buffer 206 to determine the corresponding physical address in the page that corresponds to the page base address. If the ECC scheme is being used, the logical address is translated to a physical address on the page using the page size. If the redundancy scheme is being used, the logical address is translated to a physical address using the page size, the number of bits used for each word of data, and the number of redundancy bit used for each word of data. Since the redundancy scheme typically uses more bits to store the both the data and the redundant data, there will be fewer physical addresses in pages that use the redundancy scheme compared to pages where the ECC scheme is used. Note that ECC and redundancy schemes are typically not mixed in a single page; pages 212-218 are typically designated by the programmer to use either the ECC scheme or the redundancy scheme, but not both.

Address translation circuit 208 send an aggregation control signal to data aggregator 210. The aggregation control signal indicates how many words 222, 224 in a page are used to represent a particular address. For example, if ECC is being used to correct errors for page 214, and 7 bits of ECC data is required for every 32 bits of data. Each word or row 222, 224 of page 214 includes 39 bits. As another example, if full redundancy is being used, each word or row 222, 224 of page 214 still includes 39 bits with 16 bits being used for the data, 16 bits being used for a redundant copy of the data, and 7 bits being unused. Since the data and the redundancy bits each require 32 bits, two words or rows 222, 224 of page 214 are required to store each word of data. If multiple rows or words 222, 224 of OTP element bank 211 are required, the data for the same word can be stored in adjacent rows or words 222, 224 of page 214. Data aggregator 210 combines the data from two or more rows or words 222, 224 of the accessed page 214, and provides the aggregated data to processor 102.

ECC and redundancy logic 228 is configured to provide an error indicator for the data output by data aggregator 210. When the first bit of the first line 226 of the accessed page 214 indicates ECC is being used, corresponding ECC bits are used to provide an ECC error indicator that is provided to processor 102 along with the data. When the first bit of the first line 226 of the accessed page 214 indicates redundancy is being used for error correction, corresponding redundant data is used to provide a redundancy error indicator to processor 102 from ECC and redundancy logic 228.

FIGS. 4-6 illustrate tables 400, 500, 600 showing examples of memory usage for different combinations of error correction techniques for the OTP memory 108 of FIG. 2. In FIG. 4, Table 400 shows an example of usage of memory 104 (FIG. 1) when redundancy is used exclusively to correct errors in memory 104. A first column labeled "Physical Word" is numbered from 1 to 32, representing the number of words in a page. A second column is labeled "Correction Mode" and includes the number "1" in each row to indicate the redundancy correction mode is used for each word. A third column is labeled "Logical Address" and increments by 2 in hexadecimal number format. The numbers in the rows of column 3 range from '0000'X to '003E'X. A fourth column is labeled "Decimal" and increments by 2 in decimal format. The numbers in the rows of column 4 range from 1 to 62. Each word includes 32 bits, and memory 104 is byte addressable, each word will be used to store 16 bits of the original data and 16 bits of redundant data for the original data. Thus, each word will only have 2 addressable bytes. For a page with 32 words, there are only 62 (decimal) addressable bytes.

In FIG. 5, Table 500 shows an example of usage of memory 104 (FIG. 1) when a combination of redundancy and ECC is used to correct errors in memory 104. A first column labeled "Physical Word" is numbered from 1 to 32, representing the number of words in a page. A second column is labeled "Correction Mode" and includes the number "1" in rows 1 through 10 to indicate the redundancy correction mode is used for the first 10 words while the number "0" in rows 11-32 indicate ECC is used for words 11-32. A third column is labeled "Logical Address" and increments by 2 in hexadecimal number format for words 1-10 and by 4 in hexadecimal format for words 11-32. The numbers in the rows 1-10 of column 3 range from '0000'X to '0012'X, while the numbers in rows 11-32 of column 3 range from '0014'X to '0068'X. A fourth column labeled "Decimal" increments by 2 in decimal format in rows 1-10 and by 4 in decimal format in rows 11-32. The numbers in the rows of column 4 range from 1 to 18 for rows 1-10 and 20 to 104 in rows 11-32. Each word includes 32 bits, and memory 104 is byte addressable. Each word in rows 1-10 will be used to store 16 bits of the original data and 16 bits of redundant data for the original data. Thus, each word will only have 2 addressable bytes. Each word in rows 11-32 will be used to store 32 bits of original data and will have 4 addressable bytes. For a page with 32 words with the combination of redundancy and ECC shown, there are 104 (decimal) addressable bytes.

In FIG. 6, Table 600 shows an example of usage of memory 104 (FIG. 1) when ECC is used exclusively to correct errors in memory 104. A first column labeled "Physical Word" is numbered from 1 to 32, representing the number of words in a page. A second column is labeled "Correction Mode" and includes the number "0" in rows 1 through 32 to indicate ECC is used for words 1-32. A third column is labeled "Logical Address" and increments by 4 in hexadecimal format for words 1-32. The numbers in the rows 1-32 of column 3 range from '0000'X to '007C'X. A fourth column labeled "Decimal" increments by 4 in decimal format in rows 1-32. The numbers in rows 1-32 of column 4 range from 1 to 124. Each word includes 32 bits, and memory 104 is byte addressable. Each word in rows 1-32 will be used to store 32 bits of the original data. Thus, each word will have 4 addressable bytes. For a page with 32 words using ECC exclusively as shown, there are 124 (decimal) addressable bytes.

FIGS. 4-6 thus illustrate examples of memory usage for various combinations of error correction techniques, ranging from the maximum number of addressable bytes with ECC, to the minimum number of addressable bytes with redundancy.

By now it should be appreciated that in selected embodiments, there has been provided an integrated circuit that can comprise a one-time programmable (OTP) memory having a plurality of pages, wherein a predefined section of each page is configured to store error policy bits, wherein when an indicator in a first predefined location has a first value, the page is configured to store data with error correction code (ECC) bits, and when the indicator has a second value, at least a portion of the page is configured to store data with redundancy. Address translation circuitry can be configured to, in response to receiving an access address, use a second predefined location of an accessed page of the plurality of pages accessed by the access address to determine a physical address in the accessed page which corresponds to the access address.

In another aspect, when the indicator of the accessed page has the first value, the physical address corresponding to the access address can have a first physical address value, and when the indicator of the accessed page has the second value, the physical address corresponding to the access address can have a second physical address value different from the first physical address value.

In another aspect, the second physical address can have a greater offset from a base address of the accessed page as compared to the first physical address.

In another aspect, the integrated circuit can further comprise output circuitry configured to, when the indicator of the accessed page has the first value, provide data from the physical address as output data.

In another aspect, the output circuitry can be configured to, when the indicator of the accessed page has the second value, provide data from the physical address aggregated with data from a second physical address of the accessed page as output data.

In another aspect, the second physical address can be in an adjacent line of the accessed page to the physical address.

In another aspect, the OTP memory can further comprise ECC and redundancy logic configured to provide an error indicator for the output data, wherein the ECC and redundancy logic is configured to, when the indicator has the first value, use corresponding ECC bits to provide the error indicator and when the indicator of the accessed page has the second value, use corresponding redundant data to provide the error indicator.

In another aspect, for each page, when the indicator has the second value, a remaining portion of the page is configured to store data with ECC bits.

In another aspect, the OTP memory has a master word configured to store attribute information for the OTP memory.

In another aspect, the attribute information comprises a page size for the OTP memory.

In another aspect, the attribute information comprises lock bits for each page of the plurality of pages of the OTP memory.

In another aspect, the integrated circuit can further comprise a page offset calculator configured to use the page size of the attribute information and the access address to determine a page base address of the accessed page.

In other embodiments, a method of operating a one-time programmable (OTP) memory device having a plurality of pages, wherein a predefined section of each page is configured to store error policy bits, can comprise, when an indicator in a first predefined location of a page has a first value, storing data with error correction code (ECC) bits in the page, and when the indicator has a second value, storing data with redundancy in the page. In response to receiving an access address, using a second predefined location of an accessed page of the plurality of pages accessed by the access address to determine a physical address in the accessed page which corresponds to the access address.

In another aspect, when the indicator of the accessed page has the first value, the physical address corresponding to the access address has a first physical address value, and when the indicator of the accessed page has the second value, the physical address corresponding to the access address can have a second physical address value different from the first physical address value.

In another aspect, the second physical address can have a greater offset from a base address of the accessed page as compared to the first physical address.

In another aspect, the method can further comprise, when the indicator of the accessed page has the first value, providing data from the physical address as output data.

In another aspect, the method can further comprise, when the indicator of the accessed page has the second value, providing data from the physical address aggregated with data from a second physical address of the accessed page as output data.

In another aspect, the second physical address is in an adjacent line of the accessed page to the physical address.

In another aspect, the method can further comprise providing an error indicator for the output data, wherein the ECC and redundancy logic is configured to, when the indicator has the first value, using corresponding ECC bits to provide the error indicator and when the indicator of the accessed page has the second value, using corresponding redundant data to provide the error indicator.

In another aspect, the method can further comprise, when the indicator has the second value, storing data with ECC bits in a remaining portion of the page.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIGS. 1 and 2, and the discussion thereof, describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are circuitry located on a single integrated circuit or within a same device. Alternatively, system 100 may include any number of separate integrated circuits or separate devices interconnected with each other. For example, any one or more of memory 104, OTP controller 106 and OTP memory 108 may be located on a same integrated circuit as processor 102 or on a separate integrated circuit or located within another peripheral or slave discretely separate from other elements of system 100. Also for example, system 100 or portions thereof may be soft or code representations of physical circuitry or of logical representations convertible into physical circuitry. As such, system 100 may be embodied in a hardware description language of any appropriate type.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, the integrated circuit comprising:
    a one-time programmable (OTP) memory having a plurality of pages, wherein a predefined section of each page is configured to store error policy bits, wherein when an indicator in a first predefined location of the predefined section has a first value, the page is configured to store data with error correction code (ECC) bits, and when the indicator has a second value, at least a portion of the page is configured to store data with redundancy; and
    address translation circuitry configured to, in response to receiving an access address, use a second predefined location of an accessed page of the plurality of pages accessed by the access address to determine a physical address in the accessed page which corresponds to the access address.

2. The integrated circuit of claim 1, wherein when the indicator of the accessed page has the first value, the physical address corresponding to the access address has a first physical address value, and when the indicator of the accessed page has the second value, the physical address corresponding to the access address has a second physical address value different from the first physical address value.

3. The integrated circuit of claim 2, wherein the second physical address has a greater offset from a base address of the accessed page as compared to the first physical address.

4. The integrated circuit of claim 1, further comprising output circuitry configured to, when the indicator of the accessed page has the first value, provide data from the physical address as output data.

5. The integrated circuit of claim 4, wherein the output circuitry is configured to, when the indicator of the accessed page has the second value, provide data from the physical address aggregated with data from a second physical address of the accessed page as output data.

6. The integrated circuit of claim 5, wherein the second physical address is in an adjacent line of the accessed page to the physical address.

7. The integrated circuit of claim 5, wherein the OTP memory further comprises:
    ECC and redundancy logic configured to provide an error indicator for the output data, wherein the ECC and redundancy logic is configured to, when the indicator has the first value, use corresponding ECC bits to provide the error indicator and when the indicator of the accessed page has the second value, use corresponding redundant data to provide the error indicator.

8. The integrated circuit of claim 1, wherein for each page, when the indicator has the second value, a remaining portion of the page is configured to store data with ECC bits.

9. The integrated circuit of claim 1, wherein the OTP memory has a master word configured to store attribute information for the OTP memory.

10. The integrated circuit of claim 9, wherein the attribute information comprises a page size for the OTP memory.

11. The integrated circuit of claim 9, wherein the attribute information comprises lock bits for each page of the plurality of pages of the OTP memory.

12. The integrated circuit of claim 9, further comprising:
    a page offset calculator configured to use the page size of the attribute information and the access address to determine a page base address of the accessed page.

13. A method of operating a one-time programmable (OTP) memory device having a plurality of pages, wherein a predefined section of each page is configured to store error policy bits, the method comprising:
    when an indicator in a first predefined location of a page has a first value, storing data with error correction code (ECC) bits in the page, and when the indicator has a second value, storing data with redundancy in the page; and
    in response to receiving an access address, using a second predefined location of an accessed page of the plurality of pages accessed by the access address to determine a physical address in the accessed page which corresponds to the access address.

14. The method of claim 13, wherein when the indicator of the accessed page has the first value, the physical address corresponding to the access address has a first physical address value, and when the indicator of the accessed page has the second value, the physical address corresponding to the access address has a second physical address value different from the first physical address value.

15. The method of claim 14, wherein the second physical address has a greater offset from a base address of the accessed page as compared to the first physical address.

16. The method of claim 13, further comprising, when the indicator of the accessed page has the first value, providing data from the physical address as output data.

17. The method of claim 16, further comprising, when the indicator of the accessed page has the second value, providing data from the physical address aggregated with data from a second physical address of the accessed page as output data.

18. The method of claim 17, wherein the second physical address is in an adjacent line of the accessed page to the physical address.

19. The method of claim 17, further comprising:
    providing an error indicator for the output data, wherein the ECC and redundancy logic is configured to, when the indicator has the first value, using corresponding ECC bits to provide the error indicator and when the indicator of the accessed page has the second value, using corresponding redundant data to provide the error indicator.

20. The method of claim 13, further comprising, when the indicator has the second value, storing data with ECC bits in a remaining portion of the page.

* * * * *